United States Patent [19]

Buhl et al.

[11] Patent Number: 4,919,968
[45] Date of Patent: Apr. 24, 1990

[54] METHOD AND APPARATUS FOR VACUUM VAPOR DEPOSITION

[75] Inventors: Rainer Buhl, Sargans, Switzerland; Christof Peyer, Schaan, Liechtenstein

[73] Assignee: Balzers Aktiengesellschaft, Fürstentum, Liechtenstein

[21] Appl. No.: 163,296

[22] Filed: Mar. 2, 1988

[30] Foreign Application Priority Data

Mar. 6, 1987 [CH] Switzerland ............... 00841/87

[51] Int. Cl.⁵ .............................. B05D 3/06
[52] U.S. Cl. .................. 427/37; 204/178; 219/121.11
[58] Field of Search .......... 427/37; 204/178; 219/121.11

[56] References Cited

U.S. PATENT DOCUMENTS

| | | | |
|---|---|---|---|
| 3,625,848 | 12/1971 | Snaper | 204/192.38 |
| 3,956,093 | 5/1976 | McLeod | 204/192.15 |
| 4,438,153 | 3/1984 | Pinkhasov | 427/37 |
| 4,448,659 | 5/1984 | Morrison, Jr. | 204/192.38 |
| 4,600,489 | 7/1986 | Lefkow | |
| 4,645,895 | 2/1987 | Boxman et al. | 427/37 |

FOREIGN PATENT DOCUMENTS 0106638 6/1983 European Pat. Off. .
63-26346 2/1988 Japan .
WO85/03954 9/1985 PCT Int'l Appl. .

*Primary Examiner*—Stanley Silverman
*Attorney, Agent, or Firm*—McGlew & Tuttle

[57] ABSTRACT

During electric arc discharge discrete points of the cathode surface are so strongly heated that ionized cathode material is volatilized. Use of such hot spots as vapor source for vacuum coating is, however, impaired by the fact that a short time after beginning of the vapor emission from a hot spot molten material in the form of droplets is also hurled away. The invention provides continuous vapor deposition on the cathode surface with a metal compound which can be broken down, by which accelerated migration of the vapor emitting hot spots is forced in such a way that the hot spots migrate away from a particular site before spatter formation starts. The cathode surface is preferentially continuously sputtered so strongly that the metal quantity supplied to it through the metal compound is 12 to 25% of the quantity of metal carried off through vaporization from hot spots. An installation for carrying out the invention includes two cathodes which continuously coat each other in the presence of a gas forming the requisite metal compound.

8 Claims, 3 Drawing Sheets

FIG. 3      SPATTERS FREQUENCY

METHOD AND APPARATUS FOR VACUUM VAPOR DEPOSITION

FIELD AND BACKGROUND OF THE INVENTION

This invention relates in general to vacuum vapor deposition and in particular to a new and useful method and apparatus for vacuum vapor deposition with an electric arc discharge.

With the use of plasma-supported vacuum coating processes the spectrum of compounds, which can be generated reactively by supplying the requisite components from different sources in the deposition on a substrate, was considerable expanded beyond the widespread production of oxides. Most often a required metal component is introduced into the deposition chamber by vaporization or by sputtering, while the second or further components are admitted in the gaseous state.

Metal vaporization from hot spots (cathode points) is well suited for plasma-supported coating, since the hot spots emit the cathode material essentially not as neutral vapor, as other sources used for vacuum coating do, but for a major part as ions. These form together with the emitted electrons a plasma of high charge carrier density, which permits coating at a high rate. Simultaneously, through the plasma-supported layer formation favorable layer properties such as high density, good strength, little roughness are achievable and that for layers. The layers are well as, in particular for layers of compounds of this vapor with added "reactive gases, so that on the substrates a layer of the corresponding compound originates.

With planar cathodes the direction distribution of the emitted ions obeys nearly the cos law, that is, the stream of vaporized metal observed in a direction, which $\alpha$ with the perpendicular on the cathode surface includes angle $\alpha$— is smaller by the factor cos $\alpha$ than the emission in the perpendicular. This intensity distribution also applies approximately to the emissions of other known vapor sources for vacuum coating. Consequently, from the view point of rational coating it is expedient, to arrange the substrate to be coated near the perpendicular assigned to the vaporizing area of the source. When vaporizing from hot spots this is recommended for another reason also.

In contrast to other sources, the material of so-called hot spots is emitted from the surface of the cathode to a significant extent in the form of small liquid droplets in a direction distribution different from the ions, which in flight or upon impinging on the substrate solidify and in this way lend diverse disadvantageous properties to the layer. These properties include increased roughness of the layer surface, contamination of layers which are intended to be formed as chemical compound with metal vapor, increased roughness of the layer surface, contamination of layers which are intended to be formed as chemical compound with metal vapor, increased corrosion susceptibility after the spatters have been removed, and others. The least spatters are found on substrates, which are arranged in the vicinity of the perpendicular, that is where at the same time the coating rate is at a maximum.

Arrangements customary until today for vacuum coating using vaporization from hot spots, utilize these different emission characteristics of vapor and spatter in order to obtain layers with the least possible number of errors through spatters. For this purpose the substrates are arranged near each other in a small region relative to the diameter of the cathode or at a great distance from the cathode so that the mid-perpendiculars constructed on the cathode areas are directed toward the center of the individual substrates. However, the great spacing distance of the cathodes required of the substrates in this arrangement, and the small number of substrates which can be placed near the perpendiculars, does not permit cost-efficient low-spatter coating.

Therefore, when using the so-called spark vaporizer, for the sake of cost-efficient fabrication, compromises in the direction toward smaller distance respectively to more extensive substrate fields have been accepted in the bargain, which, however, carried with it substantial worsening with respect to spatter. Different known attempts are aimed at decreasing spatter without concurrent impairment of cost-effectiveness. It is known, that the number of spatters can be decreased, if the presence (dwelling time) of the hot spot at the particular site of the cathode is only brief. However, switching off the current and re-igniting after a short interruption as suggested for this purpose is not compatible with coating on a commercial scale.

It is known that the number of simultaneously active hot spots is a function of the current available for the cathode sputtering discharge, with a hot spot— depending on the cathode material— emitting a current between 50 and 150 A. The hot spots move statistically back and forth over the cathode surface. Through suitable magnetic fields they can be limited to moving within a selected region. Through a strong magnetic field directed parallel to the surface of the cathode, which, however, would need to change its direction in the plane, short dwelling times of the hot spots could also be achieved. Such procedure, would, however, be cumbersome and would not gain acceptance by the industry.

SUMMARY OF THE INVENTION

Therefore, it is the task of the invention of making available a method for vacuum deposition using hot spots of an electric arc discharge as vapor source, which permits low-spatter coating of substrates with greater degree of cost-effectiveness than has been possible until today.

The invention builds on the observation that after igniting the discharge during a particular time span the ions required for the formation of a compact layer are, in fact, emitted, however, almost no spatters. In this time apparently a contamination layer generated during the preceding flooding is stripped off the cathode surface. It has also been measured that the mean rate of motion of the hot spots during this time is significantly increased. This apparently also decreases the mean dwelling time at a particular site of the cathode surface and this has the favorable effect of suppressing the generation of spatters.

Coating the cathode as suggested by the invention with a metal compound, for example with reactively generated TiN, does not only produce a decrease in the mean dwelling time during a brief initial time span, but continuously. So that cathode coating taking place in equilibrium with cathode stripping suffices for the purposes of the invention, the coating rate relative to the mean stripping rate of the cathode, which is proportional to the current density of the sputtering discharge, must be above a material-dependent minimum value. The effect according to the invention does not set in abruptly but occurs gradually with increasing ratio of coating rate to stripping rate. In particular for reactive coatings, that is, for the fabrication of layers of compounds in such a manner, the components required for forming the compound of one kind are supplied to the reaction chamber through vaporization, and of another kind in the gaseous state (as in the formation of TiN out of vaporized titanium and introduced nitrogen, for example), the method according to the invention has proven to be very effective. In the receiver several cathodes can be arranged so that they not only coat the substrates but also each other. If simultaneously the cathodes for the vaporization through hot spots represent large areas, so that the mean current density is not too high, layers can still be achieved in directions, which are inclined by more than 45° to the perpendicular on the cathode surface. Layers which have fewer spatters than layers which when using a single cathode or several cathodes, which do not fulfill the conditions according to the invention, are obtained in directions 25° to the perpendicular. Hence, through the invention, without sacrificing quality, a significant enlargement of the solid angle available for arranging the substrates to be coated is achieved and concimtantly a considerable increase of cost-efficiency.

Accordingly it is an object of the invention to provide an improved vapor deposition device which includes an evacuation chamber housing with a cathode in the housing connected to a negative current source and with an anode in the housing surrounding the cathode and connected to a positive current source and with the holder for the substrate to be coated positioned in the housing and with a cylindrical sheet disposed between the cathode and the anode which shields the cathode so as to form a hot spot at the cathode end to effect heating of the cathode to volatize the material of the cathode and to provide a vapor source for vacuum coating on a substrate carried on the holder which includes either two cathodes to continuously coat each other in the presence of gas forming the requisite metal compound or an auxiliary device with a continuous vapor deposition of the cathode area with a metal compound.

A further object of the invention is to provide a method of vacuum deposition which comprises generating an electric arc discharge between an anode and a cathode and subjecting the cathode to continuous vapor deposition with a metal compound which is placed in the arc discharge and is broken down by the arc discharge.

A further object of the invention is to provide a vapor deposition device which is simple in design, rugged in construction, and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
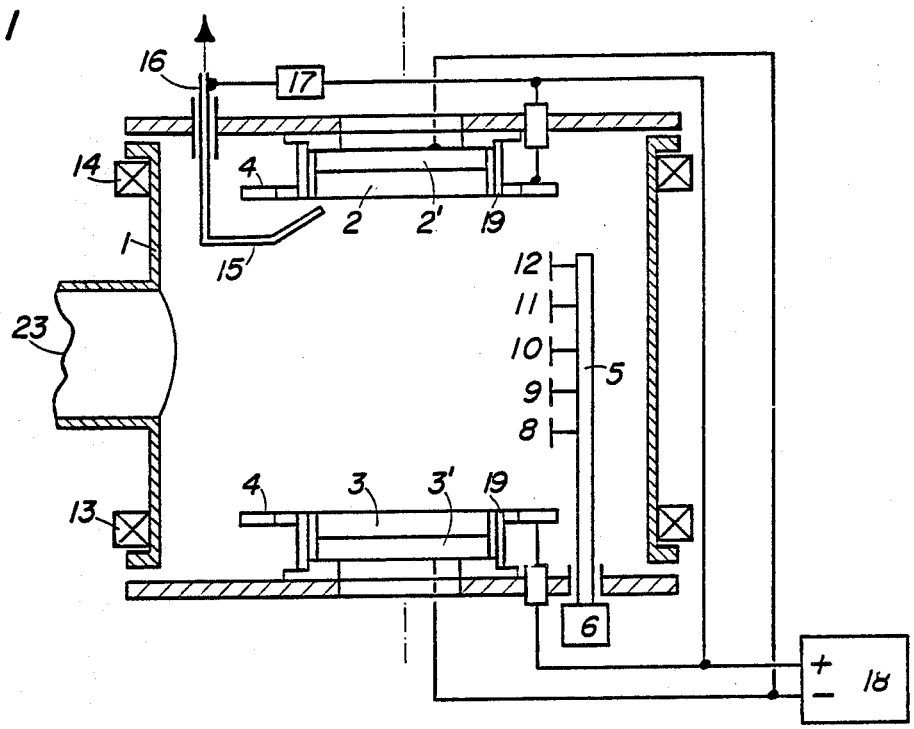
FIG. 1 is a section through a vacuum coating installation for carrying out the invention, which has two cathodes, which coat each other.

Referring to the drawings in particular the invention embodied therein comprises the method for vacuum deposition which includes generating an electric arc discharge between an anode 4 and a cathode 3 and subjecting the cathode 3 to a continuous vapor deposition with a metal compound which is placed in the arc discharge and is broken down by the arc discharge. In accordance with the invention, in the embodiment of FIG. 1 two cathodes 2 and 3 are employed which continuously coat each other in the presence of a gas forming the requisite metal compound. In the embodiment of FIG. 2 an auxiliary device includes an anode 20 carrying a metal compound 22 with a cathode 2 which is maintained at an operation to carry out continuous vapor deposition with the metal compound and which continuously coat each other in the presence of a gas forming the requisite metal compound.

Figure 2:
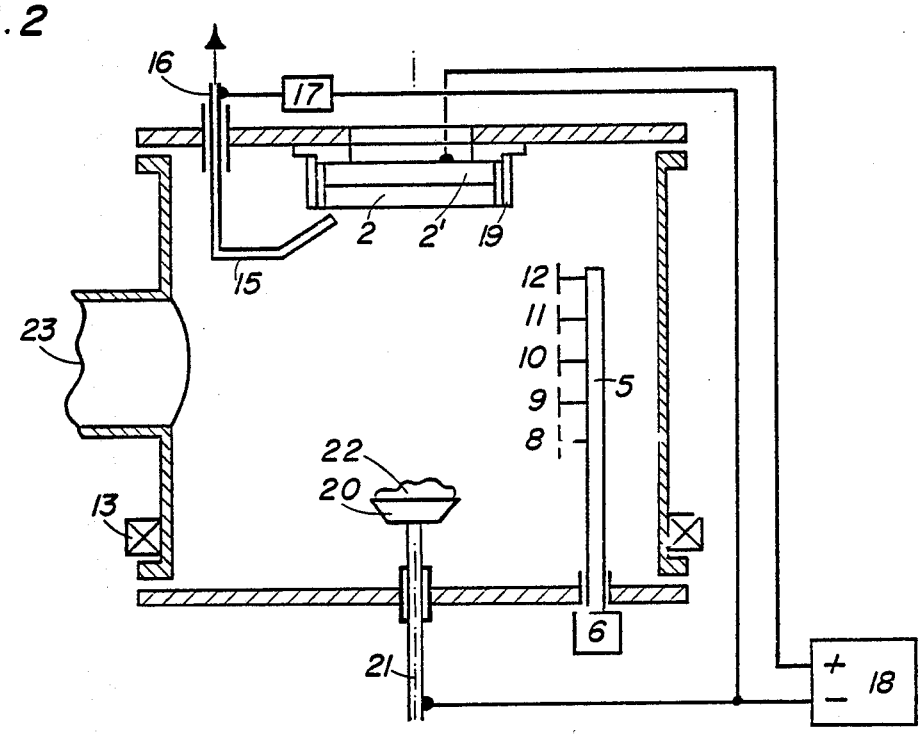
FIG. 2 is a section similar to FIG. 1 of another embodiment with only one cathode, however, with an auxiliary device for thermal vapor deposition of the cathode with a metal compound.

In FIG. 1, 1 is a cylindrical vacuum deposition chamber, which through pump aperture 23 can be evacuated. Arranged in it are cathodes 2 and 3, which are fastened electrically insulated through insulators in the form of discs on the cover and floor of the installation. They are each equipped with cooling pocket 2' respectively 3', in order to carry off the developing dissipated heat. Each of the two cathodes is connected with the negative pole of the current source 18, the positive pole of which is guided to one disc 4 each, which surrounds each cathode annularly (thus represent anodes), which divert the electrons from the gas discharge again.

Each cathode is expediently additionally equipped with a socalled ignition finger 15 (only the one for the upper cathode is shown), which can be moved in the direction of the arrow through an activation device, 16 led vacuum-tight through the chamber wall so that it is possible to contact the cathode with the ignition finger or move it away from it. The current flow is limited by a resistor 17 to a few 10 amperes. The interruption spark generated when the ignition finger is lifted off the cathode develops to form the first hot spot required for the vaporization.

The two cathodes 2 and 3 are each surrounded by cylinder-shaped insulated mounted metal sheets 19, which prevent migration of the hot spots to the cylindrical side wall of the cathode and limit them, in this way, to the front face of the cathode.

Further, coils 13 and 14 are present, they can be connected as a Helmholtz pair, which effect at low field strengths of approximately 10 Gauss provides an increase of the plasma density and an increase of the mutual coating rate of the two cathodes at constant arc current occurs.

In the deposition chamber, in addition, substrate holders 5 for substrates to be coated are arranged rotatably, which are connected with a drive 6 in order to obtain in this way more uniform coating through rotational motion. On the substrate holders 5 individual holders 8 to 12 are fastened.

The deposition installation shown in FIG. 2 differs from that of FIG. 1 only in that it has only the upper cathode 2 in the described manner and, instead of the second cathode, an auxiliary device 20 for vapor deposition with a metal compound on the upper cathode. This auxiliary device can, for example, be built as vaporization vessel set at anode potential, which is connected with an electrically insulated and vacuum-tight line 21 leading through the floor of the installation to the positive side of the voltage source 18. The crucible 20 is subjected to an electron bombardment during operation and becomes heated so that the substance 22 in it vaporizes. Within the frame of the invention, either a metal compound held in the crucible is vaporized directly or a metal, which in the presence of a reactive gas forms on the substrates a layer of the desired metal compound in the deposition chamber. Through the level of positive voltage applied to the crucible, the power supplied to it can be controlled and consequently the vaporization rate appropriately adjusted. It is here advantageous, to feed only the lower coil 13 with current, so that a magnetic field originates which is convergent to the (smaller) anode.

The embodiments below were prepared with a deposition installation according to FIG. 1, however, for this purpose an installation according to FIG. 2 can also be used or a different (known) coating installation, if the possibility is given of carrying out hot spot vaporization and concurrently coating of the cathode with a metal compound.

In a first embodiment for coating the substrate with titanium nitride, two cathodes of pure titanium were used in the arrangement of FIG. 1. The substrates were previously purified in the customary manner in solvents using ultrasound.

After achieving high vacuum, argon was introduced into the installation up to a pressure of 0.1 to 1 Pascal and a negative voltage of approximately 1000 V was applied to the substrate holders, with ions impinging on the substrates causing further purification through sputtering. After purification the argon pressure was reduced to a few $10^{-2}$ Pascal, the discharge was ignited forming hot spots on the two cathodes and the voltage applied to the substrates lowered to 70 Volt. Simultaneously, nitrogen up to a pressure of $10^1$ Pascal introduced and this pressure was held at a constant during the following coating. The arc current was set to two times 300 ampere. After a coating time of 8 minutes the TiN layer thickness on the substrates on holder positions 8 to 12 was 2.5-3.4-3.5-3.5-1.3 micrometers.

The size of the spatters and their frequency was subsequently measured on microphotographs, which reproduced an area of 0.025 mm$^2$, and the results plotted in FIG. 3. The curve termed 1 represents the mean values of the spatters on the layers on the test disks applied in position 10 (FIGS. 1 and 2) of the substrate holder; on the mentioned surface were, for example, on an average approximately 7 spatters having a cross section of 5 $\mu$m$^2$, but only 2 spatters of 20 $\mu$m$^2$.

In a second example coating with titanium nitride in the same installation proceeded in the same manner, with the only difference that a higher arc current of 2×600 A was set. Again, frequency and size on substrates mounted in position 10 were determined from microphotographs and plotted in FIG. 3 as curve 2.

To compare the invention with the state of the art, subsequently, in the same deposition installation (according to FIG. 1) coating with titanium nitride was carried out, however, without using the procedure according to the invention. The preparations took place in the same manner as in example 1, however, for coating only hot spots on the lower cathode 3 were ignited, which, therefore, during the coating process was not coated in turn by the not operated cathode 2. The current was set to 600 A. Coating time was correspondingly selected twice as long as in example 2. The distribution of spatters obtained with this arrangement on the substrates, which were mounted again in position 10, is apparent in FIG. 3 as curve 3. In comparison with the much more favorable curves 1 and 2 the great advantage according to the teaching of the invention is obvious.

Figure 3:
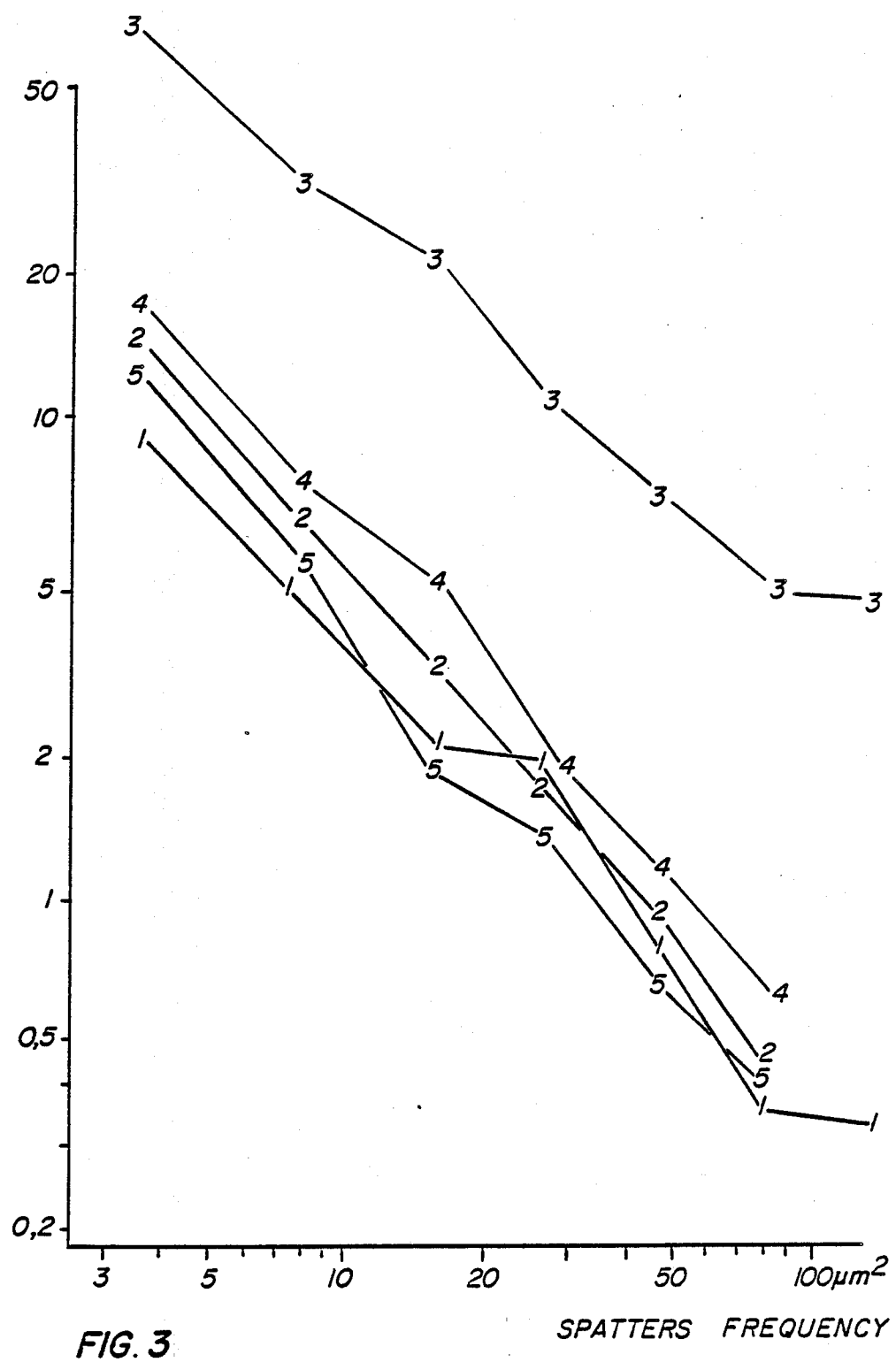
FIG. 3 is a diagram regarding the frequency of spatters of different size on layers fabricated partially according to the known state of the art, partially according to the invention.

The spatter frequencies shown in FIG. 3 refer to a mean current density of the emission surfaces of the cathode in the range of 0.7 to 1.5 A cm$^{-2}$. Since from the hot spots primarily ions are emitted, the coating rate, which one of these sources experiences from the others, can also be supported respectively reduced by influencing the path of the ions, for example, through suitable magnetic fields. In this case of coating with ions, measurements for setting the optimum precoating are particularly simple to carry out. One of the cathodes, the coating of which is to be determined, is set without igniting a spark on it by way of a current meter at the potential of one of the other cathodes. For applying coatings with titanium nitride and titanium carbonitride it was found that the optimum of low-spatter coating is achieved with back coating with an ionic current of 1 to 2% of the latter selected discharge current. Since the (electric) current of the emitted ions makes up approximately 8% of the total arc current, in this case it is found that back coating of the spark cathode is at an optimum if it is between 12 and 25% of the emitted ionic current.

This back coating, under the assumption that the reactivity is high enough, so that, as mentioned above, the desired compound is formed, can, of course, be carried out with a conventional thermal vapor deposition or with a sputtering source. The current measurement can be replaced by determining the mass of the coating applied per cm$^2$, which, for example, can be done with a piezoelectric quartz or through weighing of a coated sample substrate. (The corresponding current of ion coating is obtained on the basis of the mass of the layer deposited on the particular cathode per second multiplied by the Loschmidt number 6 . 10$^{23}$, with the specific electric charge of a simply ionized ion of 1.6 . 10$^{19}$ ampere seconds and with a factor approximately equal to 2, which takes into consideration multiply charged ions, and divided by the "atomic weight" mass of one mol of the coating material in gram).

A further example refers to coating with titanium carbonitride. Into the installation shown in FIG. 1 substrates of HSS-steel were introduced, and as reaction gas a mixture of nitrogen and a gas containing carbon (benzol, for example) in sufficient quantities to bring the volumetric content of hydrocarbons up to 50%. In this coating too the advantage of applying the invention was marked, as the associated spatter curve 4 plotted in FIG. 3 demonstrates.

Lastly, examples of coating with titanium oxide and zirconium nitride will be introduced.

For coating with titanium oxide cathodes of titanium were placed into the installation (of FIG. 1) and to the inlet valve for the reaction gas a pressure bottle with oxygen was connected. Since titanium oxides (depending on their chemical composition) are poor electric conductors or even represent good insulators, it is in this case not advisable to apply negative direct voltage to the substrates for accelerating the ions on the surface of the substrates; even after a short time the substrate surface would be neutralized by the opposite charge carried by the arriving ions. Experience shows, however, that the kinetic energy of the titanium ions emitted from the hot spots suffices to produce the activation energy required for the formation o the oxide layers. Consequently, not only electrically conducting substrates but also insulators can be coated with oxides of titanium.

During the vapor deposition, reaction gas, in this case, oxygen, is introduced through the hot spots into the deposition chamber, with not only the substrates but also the two cathodes being coated with the compound wanted as the coating material. As in coating with nitride or carbonitride the oxide increases the motion of the hot spots, and by applying the invention layers (curve 5, FIG. 3) that were significantly lower in spatters were obtained on the substrates.

For coating with zirconium nitride two disc-shaped cathodes of zirconium were installed in the deposition installation. The zirconium disks with a thickness of 6 mm were soldered onto plates of stainless steel. For carrying out the purification sputter etching of the substrate a negative voltage of approximately 300 V was applied to them, in the receiver argon (or another inert gas with good sputtering effect) up to a pressure of approximately 0.1 Pa was introduced, and the hot spots on both cathodes ignited. The current density on the substrates was $10^{-2}$ A/cm$^2$, with which the etching phase could be ended after 10 minutes, and the beginning of the coating phases could be initiated. Initially only cathode metal was vaporized, after a few seconds, however, nitrogen up to a pressure of $10^{-1}$ Pa was introduced in order to obtain zirconium nitride as coating material. The substrate voltage during the deposition of the coating was reduced to approximately −50 V.

On the substrates again the frequency distribution of the spatters was determined. The associated curve is marked 5 in FIG. 3. If a comparison coating process using only one of the zirconium cathodes is carried out, in the case of ZrN also a spatter frequency is observed, which nearly coincides with the curve in FIG. 3 labeled 3.

Figure 4:
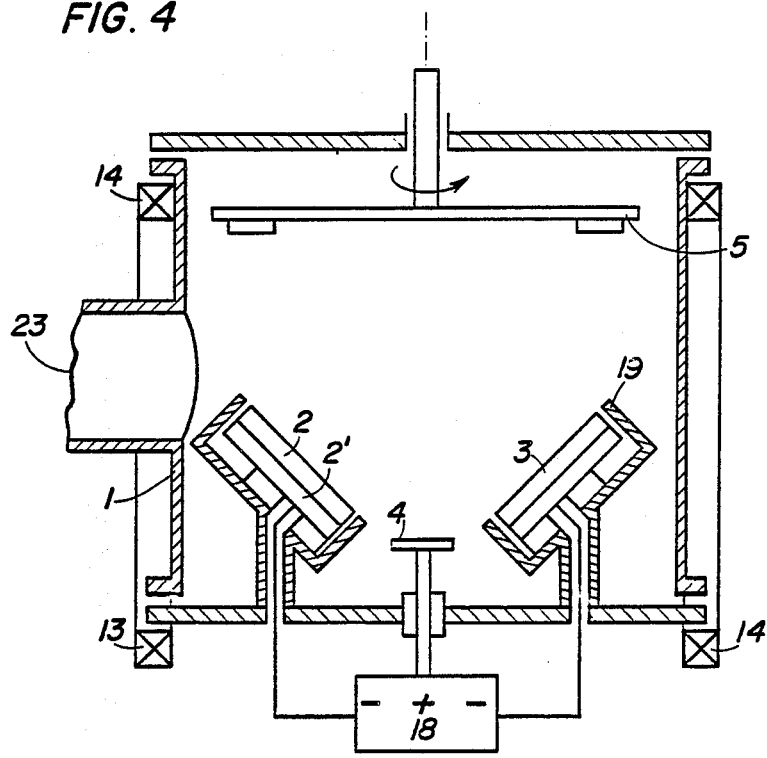
FIG. 4 is a section similar to FIG. 1 through a vacuum coating installation of another embodiment effective for carrying out the invention.

Known coating installations, which are equipped for sputtering using hot spots of electric arc discharges as vapor sources can most often be readily converted so that with the procedure according to the invention can be carried out. In contrast, the arrangements according to FIGS. 1 and 2 are new. A further new arrangement which has proven useful is shown in FIG. 4. This also has in the deposition chamber two cathodes coating each other for vaporization from the hot spots, which, however, with respect to each other and with respect to the substrate holder, as is evident from FIG. 4, are inclined at given angles. The ratio demanded under the invention of coating rate to average stripping rate can here be achieved by the distance of the two cathodes and/or by suitable setting of the magnetic field. Here too, by changing the angle, which the normals of the two cathode surfaces form with each other, the mutual coating can be changed. (The articulated connection of the cathodes required for this as well as other details of the installation are, however, not shown in FIG. 4).

What is claimed is:

1. A method for vacuum coating a substrate, comprising the steps of:

generating a first evaporation by at least one electric arc discharge between an anode and a cathode in a vacuum chamber, said electric arc discharge evaporating material comprising a metal from the cathode, at least one arc spot moving along a surface of said cathode;

exposing said substrate to a vapor comprising at least a part of said material evaporated from said cathode; and, reducing the occurrence of emitted droplets at said at least one moving arc spot by generating a second evaporation of a material during the generation of said first evaporation, coating said surface of said cathode with a coating comprising said material evaporated by said second evaporation, said coating of said surface being disruptable by said electric arc, so as to prevent said electric arc from directly hitting material of which said cathode is made as said arc spot moves along said cathode surface.

2. The method according to claim 1, wherein said second evaporation is generated of the of the same material which is evaporated from said cathode.

3. The method according to claim 1, further comprising the steps of feeding a gas into said vacuum chamber, and chemically reacting said gas with said evaporated cathode material.

4. The method according to claim 1, whereby said second evaporation is generated by generating at least one further electric arc discharge between a further cathode and an anode, said substrate being exposed to vapor generated at said one end and at said further cathode and whereby said evaporation of said one cathode acts as said second evaporation with respect to said further cathode and vice versa.

5. The method according to claim 1, wherein said coating of said surface of said cathode, comprising a metal content of 30% to 90% by weight.

6. The method according to claim 1, wherein said coating of said surface of said cathode being 12% to 25% of material evaporated from said cathode by said electric arc.

7. The method according to claim 1 wherein said material of which said cathode is made, being a metal which is comprised within said coating of said cathode.

8. A method for vacuum coating a substrate, comprising the steps of:

generating a first evaporation by at least one electric arc discharge between an anode and a cathode in a vacuum chamber, said electric arc discharge evaporating material comprising a metal which is one of cathode material or material applied to the cathode, at least one arc spot moving along a surface of said cathode;

exposing said substrate to a vapor comprising at least a part of said material evaporated from said cathode;

generating a second evaporation of a material simultaneously with the generation of said first evaporation, and, coating said surface of said cathode with a coating comprising said material evaporated by said second evaporation, said coating of said surface being disruptable by said electric arc, so as to prevent said electric arc from directly hitting material of which said cathode is made as said arc spot moves along said cathode surface.

* * * * *